US011444405B2

(12) United States Patent
Nakamura

(10) Patent No.: US 11,444,405 B2
(45) Date of Patent: Sep. 13, 2022

(54) CARD-TYPE CONNECTOR HAVING HEAT CONDUCTIVE MEMBERS EXTENDING OVER TERMINALS THEREOF

(71) Applicant: JAPAN AVIATION ELECTRONICS INDUSTRY, LIMITED, Tokyo (JP)

(72) Inventor: Tomohiro Nakamura, Tokyo (JP)

(73) Assignee: JAPAN AVIATION ELECTRONICS INDUSTRY, LIMITED, Tokyo (JP)

(*) Notice: Subject to any disclaimer, the term of this patent is extended or adjusted under 35 U.S.C. 154(b) by 3 days.

(21) Appl. No.: 17/146,831

(22) Filed: Jan. 12, 2021

(65) Prior Publication Data
US 2021/0288433 A1 Sep. 16, 2021

(30) Foreign Application Priority Data

Mar. 16, 2020 (JP) .............................. JP2020-045171

(51) Int. Cl.
*H01R 13/502* (2006.01)
*H01R 12/71* (2011.01)
(Continued)

(52) U.S. Cl.
CPC ....... *H01R 13/5025* (2013.01); *G06K 7/0056* (2013.01); *H01R 12/7076* (2013.01); *H01R 12/716* (2013.01); *H01R 12/83* (2013.01); *H01R 12/88* (2013.01); *H01R 33/7685* (2013.01); *H01R 33/97* (2013.01);
(Continued)

(58) Field of Classification Search
CPC ............ H01R 13/5025; H01R 12/7076; H01R 12/716; H01R 12/83; H01R 12/88; H01R 33/7685; H01R 33/97; H01R 12/85; H01R 13/2442; H01R 12/71; H01R 13/00; H01L 2023/4037; H01L 2023/405;
(Continued)

(56) References Cited

U.S. PATENT DOCUMENTS 9,390,299 B1* 7/2016 Beals .................. H05K 1/0203
10,622,738 B2 4/2020 Nakamura
2014/0148646 A1 5/2014 Inada

FOREIGN PATENT DOCUMENTS

CN 201274327 Y 7/2009
CN 204156173 U 2/2015
(Continued)

OTHER PUBLICATIONS

Taiwanese Office Action (and English language translation thereof) dated Oct. 8, 2021, issued in counterpart Taiwanese Application No. 110101071.

*Primary Examiner* — Abdullah A Riyami
*Assistant Examiner* — Justin M Kratt
(74) *Attorney, Agent, or Firm* — Holtz, Holtz & Volek PC

(57) ABSTRACT

A base of a connector defines an accommodation portion for accommodating a card-type device. The base has holding portions with surfaces directed to the accommodation portion. The holding portions hold held portions of terminals 40. Heat conductive members are provided on the surfaces of the holding portions. The heat conductive members are sandwiched between the card-type device and the holding portions when the card-type device is connected to the connector 10. In this way, heat conductive paths, which include the conductive members, are formed between the card-type device and held portions of the terminals 40.

5 Claims, 10 Drawing Sheets

(51) Int. Cl.
*H01R 12/88* (2011.01)
*H01R 33/76* (2006.01)
*H01R 33/97* (2006.01)
*H01R 12/70* (2011.01)
*H01R 12/83* (2011.01)
*G06K 7/00* (2006.01)
H01R 12/85 (2011.01)
H01L 23/40 (2006.01)
H01R 13/24 (2006.01)
H01R 13/00 (2006.01)

(52) U.S. Cl.
CPC .................. *H01L 2023/405* (2013.01); *H01L 2023/4037* (2013.01); *H01L 2023/4056* (2013.01); *H01L 2023/4068* (2013.01); *H01R 12/71* (2013.01); *H01R 12/85* (2013.01); *H01R 13/00* (2013.01); *H01R 13/2442* (2013.01)

(58) Field of Classification Search
CPC .... H01L 2023/4056; H01L 2023/4068; G06K 7/0056
USPC ......................................................... 439/196
See application file for complete search history.

(56) References Cited

FOREIGN PATENT DOCUMENTS

| | | | |
|---|---|---|---|
| JP | 2019067650 A | 4/2019 | |
| JP | 2020004607 A | 1/2020 | |

\* cited by examiner

CARD-TYPE CONNECTOR HAVING HEAT CONDUCTIVE MEMBERS EXTENDING OVER TERMINALS THEREOF

CROSS REFERENCE TO RELATED APPLICATIONS

This application is based on and claims priority under 35 U.S.C. § 119 to Japanese Patent Application No. JP2020-045171 filed Mar. 16, 2020, the contents of which are incorporated herein in their entirety by reference.

BACKGROUND OF THE INVENTION

This invention relates to a connector, particularly to a connector which is connectable to a card-type device.

JP 2020-4607A (Patent Document 1) discloses an example of a connector which is connectable to a card-type device. As understood from FIG. 13, a connector 90 of Patent Document 1 is what is called a hinge-type connector. This connector 90 is mounted on a circuit board (not shown) when used.

As shown in FIG. 13, the connector 90 is provided with a base 92, a cover 94 and a plurality of terminals 96. The base 92 defines an accommodation portion 920. Moreover, the base 92 has a frame 930. The cover 94 is attached to the base 92 to be openable and closable. The terminals 96 are held by the base 92.

As understood from FIG. 13, a card-type device 98 is held by the cover 94. Upon closing the cover 94, the card-type device 98 is accommodated in the accommodation portion 920 of the base 92. At this time, the terminals 96 come into contact with contact portions (not shown) of the card-type device 98. Thus, the connector 90 is connected to the card-type device 98.

When the connector 90 is connected to the card-type device 98, heat generated in the card-type device 98 is conducted to the circuit board (not shown) via the terminals 96. The terminals 96 are in point contact with the card-type device 98, so that contact areas therebetween are small. Accordingly, amount of the heat conducting from the card-type device 98 to the circuit board via the terminals 96 is limited. Therefore, the connector 90 of Patent Document 1 is provided with heat conduction paths other than the terminals 96.

Referring to FIG. 14, the frame 930 included in the base 92 of the connector 90 has first contact portions 932, second contact portions 934 and third contact portions 936. Moreover, the frame 930 has a plurality of fixed portions 938. The fixed portions 938 are fixed to fixing portions (not shown) of the circuit board (not shown) when the connector 90 is mounted on the circuit board.

As understood from FIGS. 13 and 14, the first contact portions 932, the second contact portions 934 and the third contact portions 936 come into contact with the cover 94 when the connector 90 is connected to the card-type device 98. Accordingly, the heat generated in the card-type device 98 is conducted from the cover 94 to the frame 930 and then from the frame 930 to the circuit board.

SUMMARY OF THE INVENTION

As performance of the card-type device is improved, the heat generated in the card-type device tends to be increased. Accordingly, there is a demand for a connector provided with a new heat conduction path to radiate heat of the card-type device with efficiency.

It is an object of the present invention to provide a connector which includes a new heat conduction path.

One aspect of the present invention provides a connector which is connectable to a card-type device. The connector is mounted on a circuit board when used. The connector comprises a base, a cover, a plurality of terminals and a heat conductive member. The base defines a card accommodation portion which accommodates the card-type device. The base has a holding portion made of insulation. The holding portion has a surface directed to the accommodation portion. The cover is arranged so as to cover the card-type device in an up-down direction when the card-type device is connected to the connector in the accommodation portion. The terminals are arranged in a pitch direction perpendicular to the up-down direction. Each of the terminals has a held portion, a contact point and a fixed portion. The held portion is held by the holding portion. The contact point is located in a position different from that of the held portion in a front-rear direction perpendicular to both of the up-down direction and the pitch direction. The contact point comes into contact with the card-type device when the card-type device is connected to the connector. The fixed portion is fixed to the circuit board when the connector is mounted on the circuit board. The heat conductive member is provided on the surface of the holding portion. The heat conductive member is arranged so as to extend over two or more of the terminals in the pitch direction. The heat conductive member is sandwiched between the card-type device and the holding portion when the card-type device is connected to the connector.

According to the present invention, the connector is provided with the heat conductive member. When the connector is connected to card-type device, the heat conductive member is sandwiched between the holding portion of the base and the card-type device. As a result, the heat generated in the card-type device is conducted to the base via the heat conductive member and further to the circuit board. Thus, the connector can conduct the heat generated in the card-type device to the circuit board with efficiency.

An appreciation of the objectives of the present invention and a more complete understanding of its structure may be had by studying the following description of the preferred embodiment and by referring to the accompanying drawings.

Figure 1:
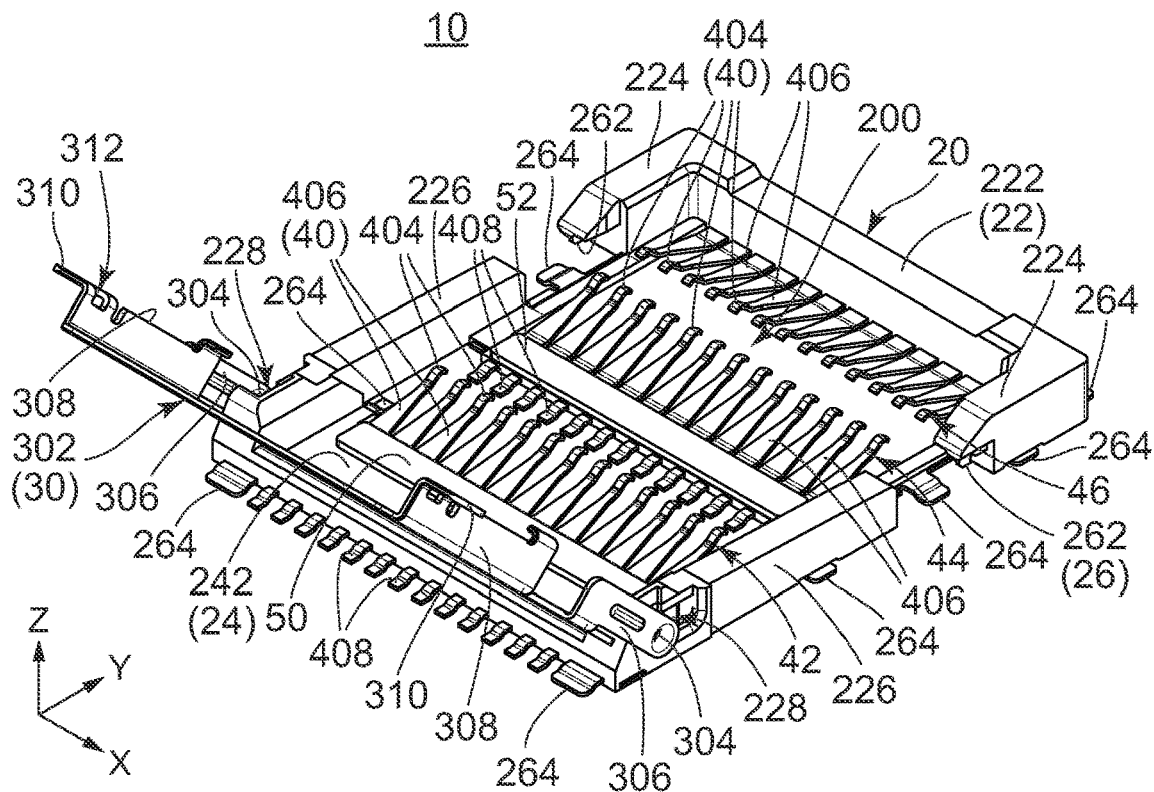
FIG. 1 is a first perspective view showing a connector according to a first embodiment of the present invention. A cover of the connector is positioned at an open position.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

First Embodiment

Figure 2:
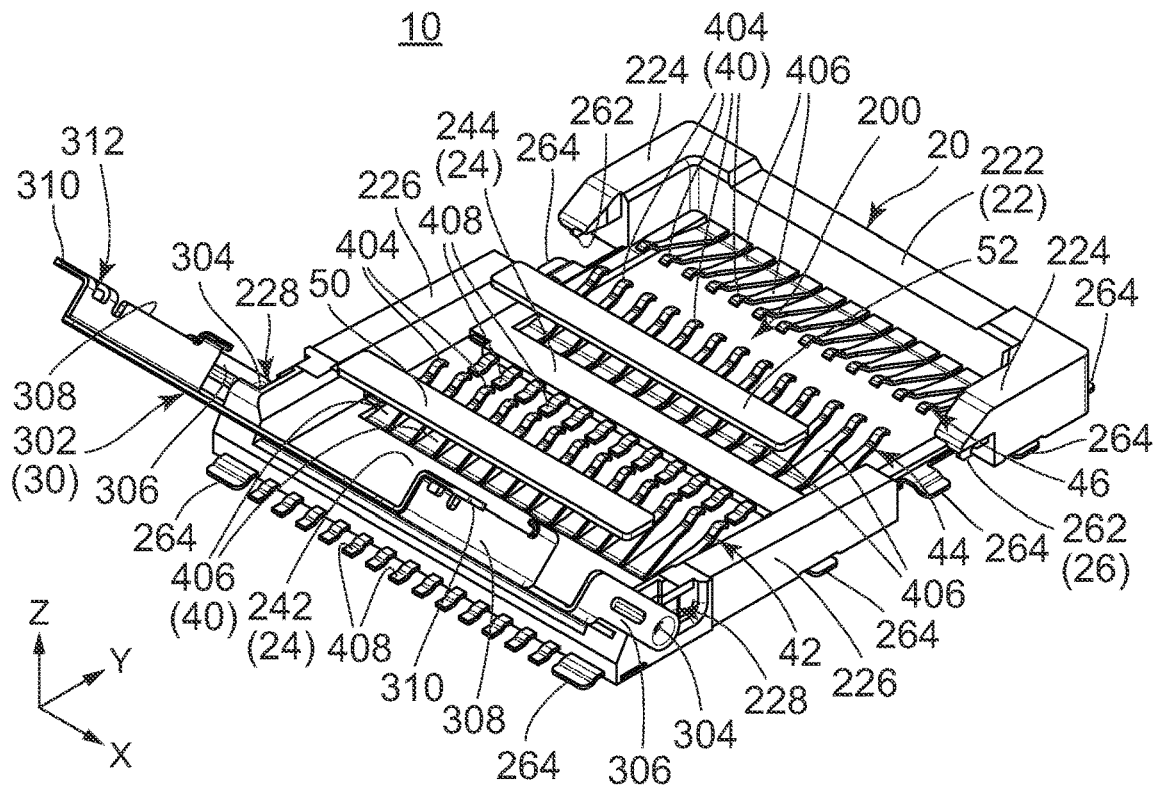
FIG. 2 is an exploded, perspective view showing the connector of FIG. 1.

Referring to FIGS. 1 and 2, a connector 10 according to a first embodiment of the present invention is provided with a base 20, a cover 30, a plurality of terminals 40 and heat conductive members 50 and 52.

As understood from FIGS. 3 to 5, the connector 10 is to be connected to a card-type device (hereinafter simply referred to as a card) 60. The connector 10 is mounted on a circuit board (not shown) when used. In the present embodiment, the connector 10 is a hinge-type connector provided with a hinge mechanism. However, the present invention is not limited thereto. The present invention is applicable to any connector other than the hinge-type connector.

Figure 3:
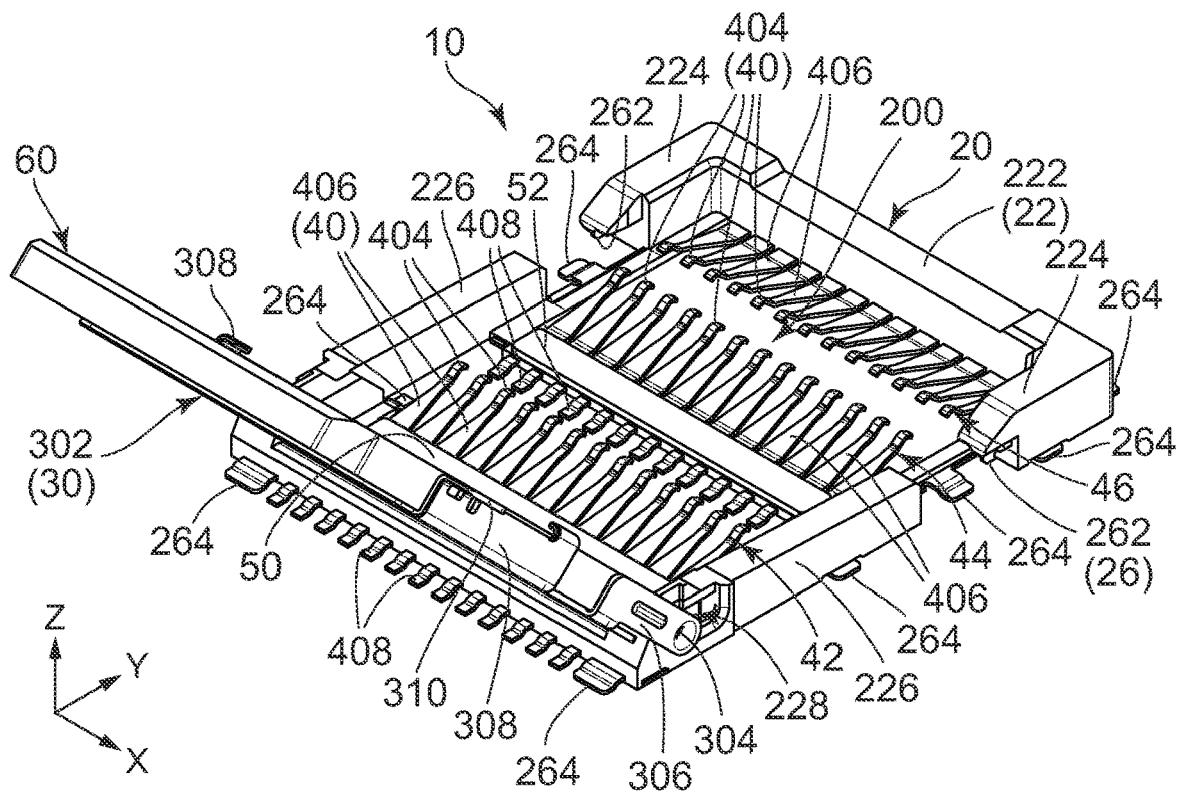
FIG. 3 is a second perspective view showing the connector of FIG. 1. The cover holds a card-type device.
Figure 4:
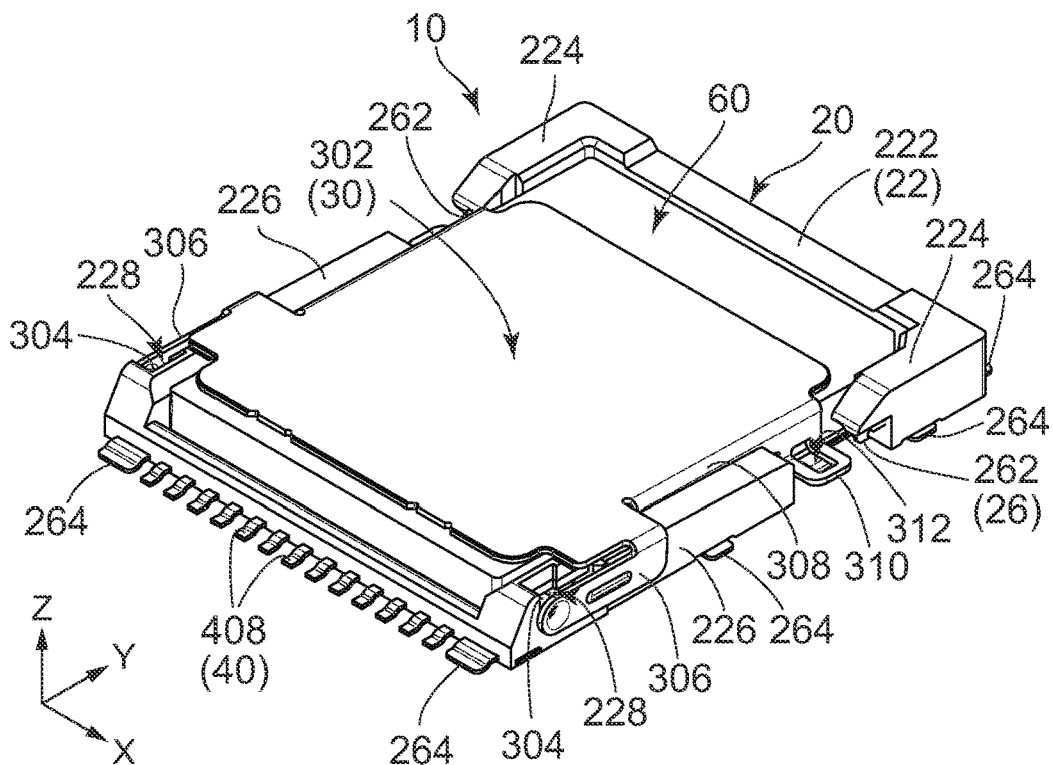
FIG. 4 is a third perspective view showing the connector of FIG. 1. The cover is positioned at a closed position. The cover holds the card-type device, and the card-type device is accommodated in an accommodation portion of a base of the connector.

As understood from FIGS. 2 to 4, the base 20 defines an accommodation portion 200 which accommodates the card 60. In detail, as shown in FIG. 2, the base 20 has a wall portion 22 and a bottom board portion 24, and the wall portion 22 and the bottom board portion 24 define the accommodation portion 200. The accommodation portion 200 opens upward in an up-down direction. The accommodation portion 200 has a rectangular shape slightly long in a front-rear direction perpendicular to the up-down direction when viewed along the up-down direction. In the present embodiment, the up-down direction is a Z-direction. A positive Z-direction is directed upward while a negative Z-direction is directed downward. In the present embodiment, the front-rear direction is a Y-direction. A positive Y-direction is directed forward while a negative Y-direction is directed rearward.

As understood from FIGS. 1 and 2, the base 20 further has a frame 26. The frame 26 is provided with a pair of lock portions 262 and a plurality of fixed portions 264. The lock portions 262 work to maintain the cover 30 in a locked position mentioned later. The fixed portions 264 are fixed to the circuit board (not shown) when the connector 10 is mounted on the circuit board. The wall portion 22 and the bottom board portion 24 are integrally formed with the frame 26. In the present embodiment, the frame 26 is made of metal, and the wall portion 22 and the bottom board portion 24 are made of insulation. In detail, the wall portion 22 and the bottom board portion 24 are integrally molded with the frame 26 using insulating resin. However, the present invention is not limited thereto. Provided that the terminals 40 are electrically separated from one another, the wall portion may be formed of metal in part.

As shown in FIGS. 1 and 2, the wall portion 22 of the base 20 has a front wall portion 222, a pair of front sidewalls 224 and a pair of rear sidewalls 226. The front wall portion 222 extends in a pitch direction perpendicular to both of the up-down direction and the front-rear direction. Moreover, the front wall portion 222 forms a front edge of the base 20. The front sidewalls 224 extend rearward from both ends of the front wall portion 222 in the pitch direction, respectively. The rear sidewalls 226 are located rearward of the front sidewalls 224, respectively, and extend in the front-rear direction. The rear sidewalls 226 are formed with bearing portions 228, respectively. The bearing portions 228 form a hinge mechanism in part.

As shown in FIG. 2, the bottom board portion 24 of the base 20 has a rear bottom board portion 242 and a middle bottom board portion 244. The rear bottom board portion 242 and the middle bottom board portion 244 are provided between the rear sidewalls 226 in the pitch direction. The rear bottom board portion 242 is located at a rear portion of the base 20 in the front-rear direction and forms a rear edge of the base 20. The middle bottom board portion 244 is located around the middle of the base 20 in the front-rear direction.

As shown in FIG. 2, the terminals 40 are held by the base 20. In the present embodiment, the terminals 40 are arranged in three rows to form a first row 42, a second row 44 and a third row 46. The first row 42, the second row 44 and the third row 46 are arranged in the front-rear direction. In each of the first row 42, the second row 44 and the third row 46, the terminals 40 are arranged in the pitch direction. However, the present invention is not limited thereto. The terminals 40 may be arranged in one row.

Figure 6:
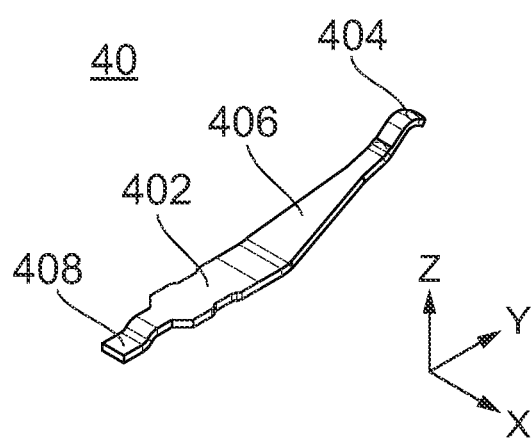
FIG. 6 is a perspective view showing a terminal of the connector of FIG. 1, wherein the terminal belongs to a second row.

As shown in FIG. 6, each of the terminals 40 of the second row 44 has a held portion 402, a contact point 404, a supporting portion 406 and a fixed portion 408. The held portion 402 is held by the base 20. The contact point 404 comes into contact with a contact portion (not shown) of the card 60 when the connector 10 is connected to the card 60. The fixed portion 408 is fixed to a fixing portion (not shown) of the circuit board (not shown) when the connector 10 is mounted on the circuit board.

As understood from FIGS. 1 and 6, the supporting portion 406 of the terminal 40 of the second row 44 extends forward in the front-rear direction from one end of the held portion 402. The supporting portion 406 supports the contact point 404 to allow the contact point 404 to be moved at least in the up-down direction. With this structure, the contact point 404 is positioned at a position different from that of the held portion 402 in the front-rear direction. The fixed portion 408 of the terminal 40 of the second row 44 extends rearward in the front-rear direction from the other end of the held portion 402. However, the present invention is not limited thereto. The fixed portion 408 may be provided on a position overlapping with that of the held portion 402 in the front-rear direction and the pitch direction.

As understood from FIGS. 1 and 2, each of the terminals 40 of the first row 42 and terminals 40 of the third row 46 is formed similarly to the terminal 40 of the second row 44. That is, each of the terminals 40 of the first row 42 and the terminals 40 of the third row 46 has a held portion 402, a contact point 404, a supporting portion 406 and a fixed portion 408. However, each of the terminals 40 of the first row 42 and terminals 40 of the third row 46 is different from the terminal 40 of the second row 44 at the following points. In the front-rear direction, a size of the terminal 40 of the first row 42 is larger than that of the terminal 40 of the second row 44. Moreover, the supporting portion 406 of the terminal 40 of the third row 46 extends rearward in the front-rear direction while the fixed portion 408 of the terminal 40 of the third row 46 extends forward in the front-rear direction.

As understood from FIGS. 2 and 6, the held portion 402 of the terminal 40 of the first row 42 is held by the rear bottom board portion 242. The held portion 402 of the terminal 40 of the second row 44 is held by the middle bottom board portion 244. The held portion 402 of the terminal 40 of the third row 46 is held by the front wall portion 222. In the present embodiment, the terminals 40 are integrally formed with the bottom board portion 24 and the front wall portion 222. In the present embodiment, the rear bottom board portion 242 and the middle bottom board portion 244 are particularly referred to as holding portions 242 and 244. That is, the held portion 402 of the terminal 40 of the first row 42 is held by the holding portion 242, and the held portion 402 of the terminal 40 of the second row 44 is held by the holding portion 244.

As shown in FIG. 2, each of the holding portions 242 and 244 has a surface or an upper surface directed to the accommodation portion 200. As understood from FIGS. 1 and 2, on the surface of the holding portion 242, the heat conductive member 50 is provided to cover the surface of the holding portion 242 at least in part. Moreover, on the surface of the holding portion 244, the heat conductive member 52 is provided to cover the surface of the holding portion 244 at least in part.

Figure 7:
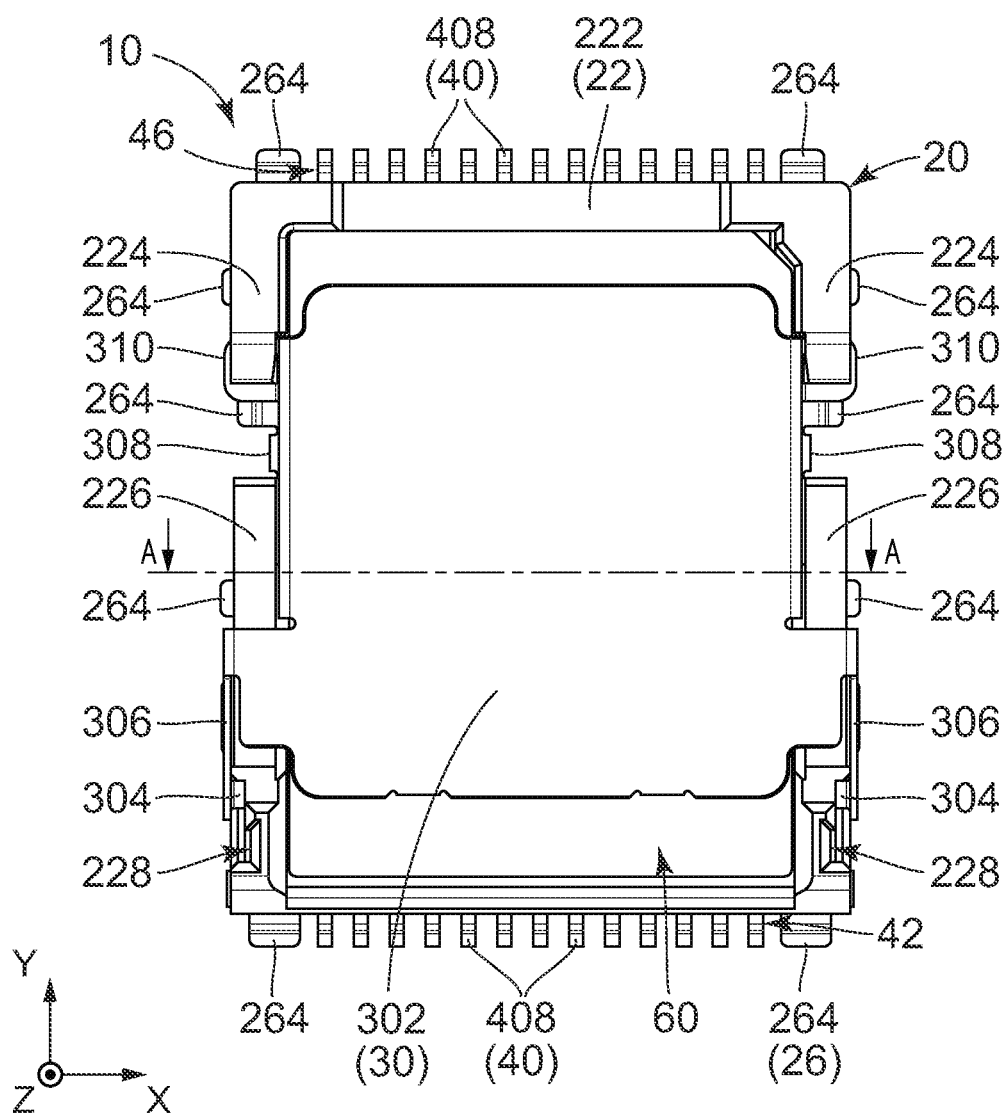
FIG. 7 is a plane view showing the connector of FIG. 5.
Figure 8:
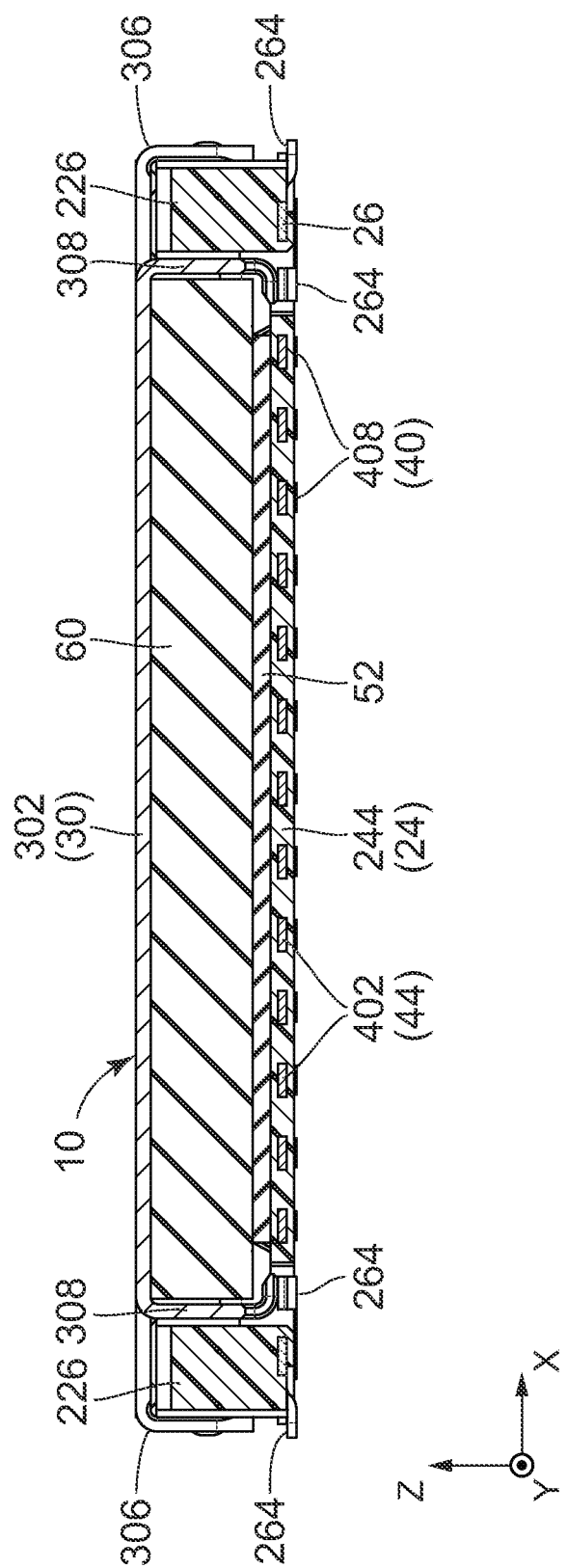
FIG. 8 is a cross-sectional view showing the connector of FIG. 7, taken along line A-A.

As understood from FIGS. 7 and 8, the heat conductive member 52 is arranged so as to extend over two or more of the terminals 40 in the pitch direction. This is because the heat conductive member 52 is of little use in conducting heat if it extends over only one of the terminals 40 in the pitch direction. In the present embodiment, the heat conductive member 52 is arranged so as to extend over all of the terminals 40 of the second row 44 in the pitch direction. In order to enlarge a heat conduction path to the extent possible, it is preferable that the heat conductive member 52 have sizes in the front-rear direction and the pitch direction to cover the whole of the surface of the holding portion 244. This results in enlargement of the heat conduction path according to the heat conductive member 52.

As understood from FIGS. 1 and 2, the heat conductive member 50 is arranged so as to extend over all of the terminals 40 of the first row 42 in the pitch direction similarly to the heat conductive member 52. It is preferable that the heat conductive member 50 have sizes in the front-rear direction and the pitch direction to cover the whole of the surface of the holding portion 242. However, with regard to the size of the heat conductive member 50 in the front-rear direction, it is necessary to consider movement of the cover 30 that holds the card 60. In the present embodiment, the heat conductive member 50 is provided on a front part of the surface of the holding portion 242.

As shown in FIG. 2, in the present embodiment, each of the heat conductive members 50 and 52 has a sheet shape long in the pitch direction. Each of the heat conductive members 50 and 52 has elasticity at least in a thickness direction of the heat conductive member 50 or 52. In other words, each of the heat conductive members 50 and 52 is elastically deformable at least in the thickness direction of the heat conductive member 50 or 52 in response to an external force. Each of the heat conductive members 50 and 52 is made of thermal rubber, for example. The thermal rubber has high resistance to high and low temperatures, heat conductivity and elasticity. A representative example of the thermal rubber is silicone rubber. However, the present invention is not limited thereto. For example, each of the heat conductive members 50 and 52 may be a metal member which has a shape resiliently deformable in the up-down direction.

Figure 5:
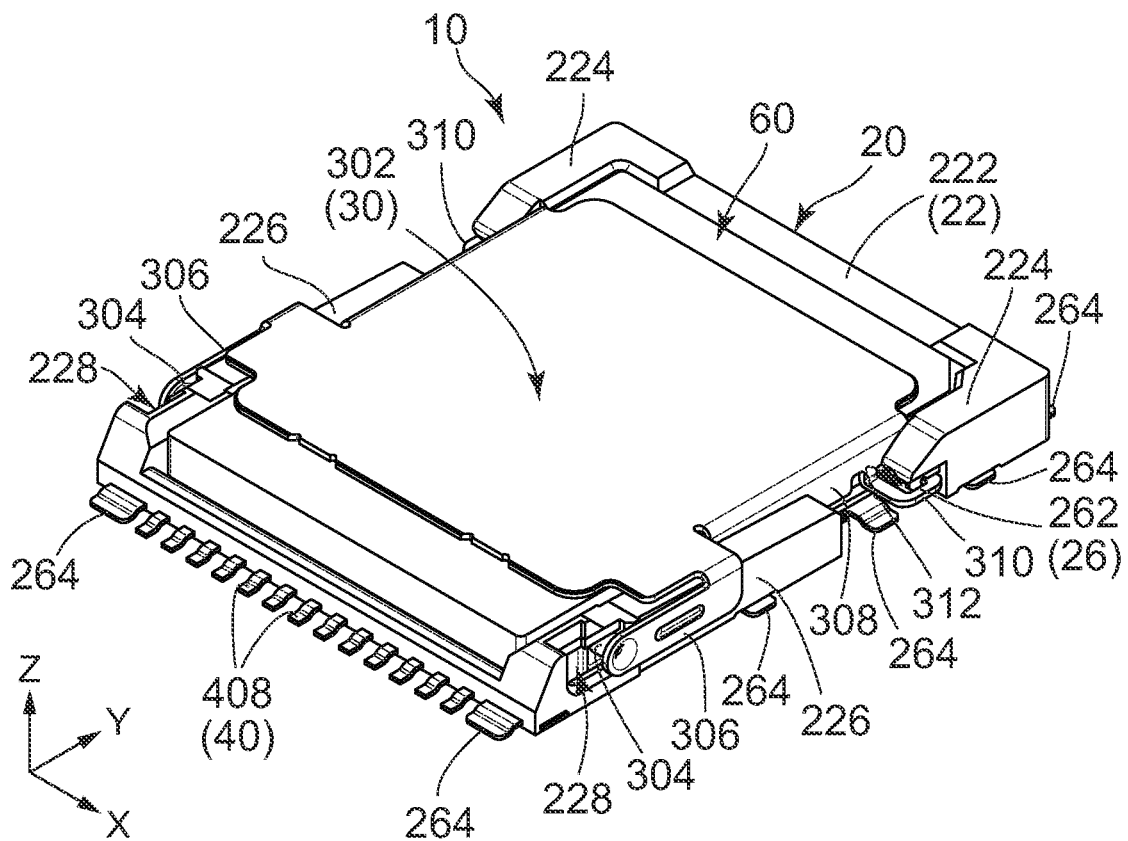
FIG. 5 is a fourth perspective view showing the connector of FIG. 1. The cover is positioned at a locked position. The cover holds the card-type device, and the card-type device is accommodated in the accommodation portion of the base.

As understood from FIGS. 3 to 5, the cover 30 is attached to the base 20 so as to be openable and closable with respect to the base 20. In detail, the cover 30 is movable between an open position shown in FIG. 3 and a closed position shown in FIG. 4. Moreover, the cover 30 is movable between the closed position shown in FIG. 4 and a locked position shown in FIG. 5. The cover 30 is arranged to cover the card 60 in the up-down direction when it is positioned at each of the closed position and the locked position. In other words, the cover 30 is arranged to cover the card 60 in the up-down direction when the card 60 is connected to the connector 10 in the accommodation portion 200.

As understood from FIGS. 4 and 5, the cover 30 has a main plate portion 302, a pair of axis portions 304, a pair of supporting portions 306, a pair of card-holding portions 308 and a pair of locked portions 310. In the present embodiment, the cover 30 is made by punching out and bending a metal sheet.

As shown in FIGS. 4 and 5, in a state that the cover 30 is positioned at the closed position or the locked position, the main plate portion 302 of the cover 30 has an approximately square shape when viewed along the up-down direction.

As understood from FIGS. 4 and 5, the axis portions 304 of the cover 30 are supported by the supporting portions 306, respectively. The axis portions 304 are provided on one ends of the supporting portions 306, respectively, and protrude inward in the lateral direction. The axis portions 304 are respectively received by the bearing portions 228 of the rear sidewalls 226. Together with the bearing portions 228, the axis portions 304 form the hinge mechanism. The axis receiving portions 228 allow the axis portions 304 to be turned about an axis extending in the pitch direction. In addition, the bearing portions 228 allow the axis portions 304 to be moved within a predetermined range in the front-rear direction. Thus, the cover 30 is attached to the base 20 by means of the hinge mechanism and movable with respect to the base 20 as described above.

As shown in FIGS. 4 and 5, the supporting portions 306 are located at both sides of the main plate portion 302 in the pitch direction. When the cover 30 is positioned at the closed position or the locked position, the supporting portions 306 are located near a rear part of the main plate portion 302. When the cover 30 is positioned at the closed position or the locked position, the supporting portions 306 protrude outward in the pitch direction from the main plate portion 302 and extend downward and then rearward.

As understood from FIGS. 2, 4 and 5, the card-holding portions 308 are located at both sides of the main plate portion 302 in the pitch direction. When the cover 30 is positioned at the closed position or the locked position, the card-holding portions 306 are located forward of the supporting portions 302, respectively. When the cover 30 is positioned at the closed position or the locked position, the card-holding portions 308 extend downward from the main plate portion 302 and then inward in the pitch direction. As understood from FIG. 3, the cover 30 can hold the card 60 loosely by means of the main plate portion 302 and the card-holding portions 308.

As understood from FIGS. 2, 4 and 5, the locked portions 310 are located at both sides of the main plate portion 302 in the pitch direction. When the cover 30 is positioned at the closed position or the locked position, the locked portions 310 are located forward of the card-holding portions 308, respectively. In the present embodiment, the locked portions 310 and the card-holding portions 308 are respectively contiguous to each other in part in the front-rear direction. When the cover 30 is positioned at the closed position or the locked position, the locked portions 310 extend downward from the main plate portion 302 and then outward in the pitch direction. The locked portions 310 are formed with apertures 312, respectively. When the cover 30 is positioned at the closed position or the locked position, the apertures 312 pierce the locked portions 310, respectively, in the up-down direction. The locked portions 310 engage with the lock portions 262 of the frame 26 when the cover 30 is positioned at the locked position.

Here, as shown in FIG. 3, it is assumed that the cover 30 positioned at the open position holds the card 60. Upon moving the cover 30 from the open position shown in FIG. 3 to the closed position shown in FIG. 4, the card 60 is accommodated in the accommodation portion 200. At this time, the card 60 receives upward reaction forces from the terminals 40 and is pressed against the main plate portion 302 of the cover 30.

Upon moving the cover 30 positioned at the closed position shown in FIG. 4 forward and removing an external force acting on the cover 30, the cover 30 is positioned at the locked position shown in FIG. 5. At this time, the lock portions 262 of the frame 26 are positioned at the apertures 312 of the locked portions 310 of the cover 30, respectively, in part. Accordingly, the cover 30 is maintained in the locked position. The card 60 is positioned at the accommodation portion 200 and cannot be substantially moved in the front-rear direction. Moreover, the card 60 is pressed against the main plate portion 302 of the cover 30 by the upward reaction forces from the terminals 40.

As understood from FIGS. 7 and 8, when the cover 30 is positioned at the locked position, the heat conductive member 52 is sandwiched between the card 60 and the holding portion 244. In other words, the heat conductive member 52 is sandwiched between the card 60 and the holding portion 244 when the card 60 is connected to the connector 10. In order to realize the aforementioned state, a thickness size of the heat conductive member 52 is equal to or slightly larger than a distance size between the card 60 and the holding portion 244 in the up-down direction. Similarly, the heat conductive member 50 is sandwiched between the card 60 and the holding portion 242 when the card 60 is connected to the connector 10. A thickness size of the heat conductive member 50 is equal to or slightly larger than a distance size between the card 60 and the holding portion 242 in the up-down direction.

As understood from FIG. 8, heat generated in the card 60 is conducted from the heat conductive member 52 to the holding portion 244. A part of the heat conducted to the holding portion 244 is conducted to the held portions 402 of the terminals 40 of the second row 44. Further referring to FIG. 3, the heat conducted to the held portions 402 of the terminals 40 of the second row 44 is conducted to the circuit board (not shown) via the fixed portions 408 of the terminals 40 of the second row 44. The remaining part of the heat conducted to the holding portion 244 is conducted to the circuit board via the frame 26. In the present embodiment, the heat conductive member 52 extends over all of the terminals 40 of the second row 44 in the pitch direction. Accordingly, the heat conducted to the holding portion 244 from the cover 30 can be dispersed to all of the terminals 40 of the second row 44. Thus, the heat of the card 60 can be conducted to the circuit board with efficiency.

The heat conductive member 50 is similar to the heat conductive member 52. That is, the heat generated in the card 60 is conducted from the heat conductive member 50 to the holding portion 242. A part of the heat conducted to the holding portion 242 is conducted to the held portions 402 of the terminals 40 of the first row 42. The heat conducted to the held portions 402 of the terminals 40 of the first row 42 is conducted to the circuit board (not shown) via the fixed portions 408 of the terminals 40 of the first row 42. The remaining part of the heat conducted to the holding portion 242 is conducted to the circuit board via the frame 26. In the present embodiment, the heat conductive member 50 extends over all of the terminals 40 of the first row 42 in the pitch direction. Accordingly, the heat conducted to the holding portion 242 from the cover 30 can be dispersed to all of the terminals 40 of the first row 42. Thus, the heat of the card 60 can be conducted to the circuit board with efficiency.

As mentioned above, the connector 10 according to the present embodiment is provided with heat conduction paths which do not pass through the contact points 404 of the terminals 40 in addition to heat conduction paths passing through the contact points 404 of the terminals 40. In addition, each of the heat conductive members 50 and 52 used as the heat conduction path is in surface contact with the card 60 and the holding portion 242 or 244. Accordingly, the connector 10 can easily conduct the heat generated in the card 60 to the holding portions 242 and 244. Thus, the connector 10 can conduct the heat generated in the card 60 to the circuit board with efficiency.

Second Embodiment

Figure 9:
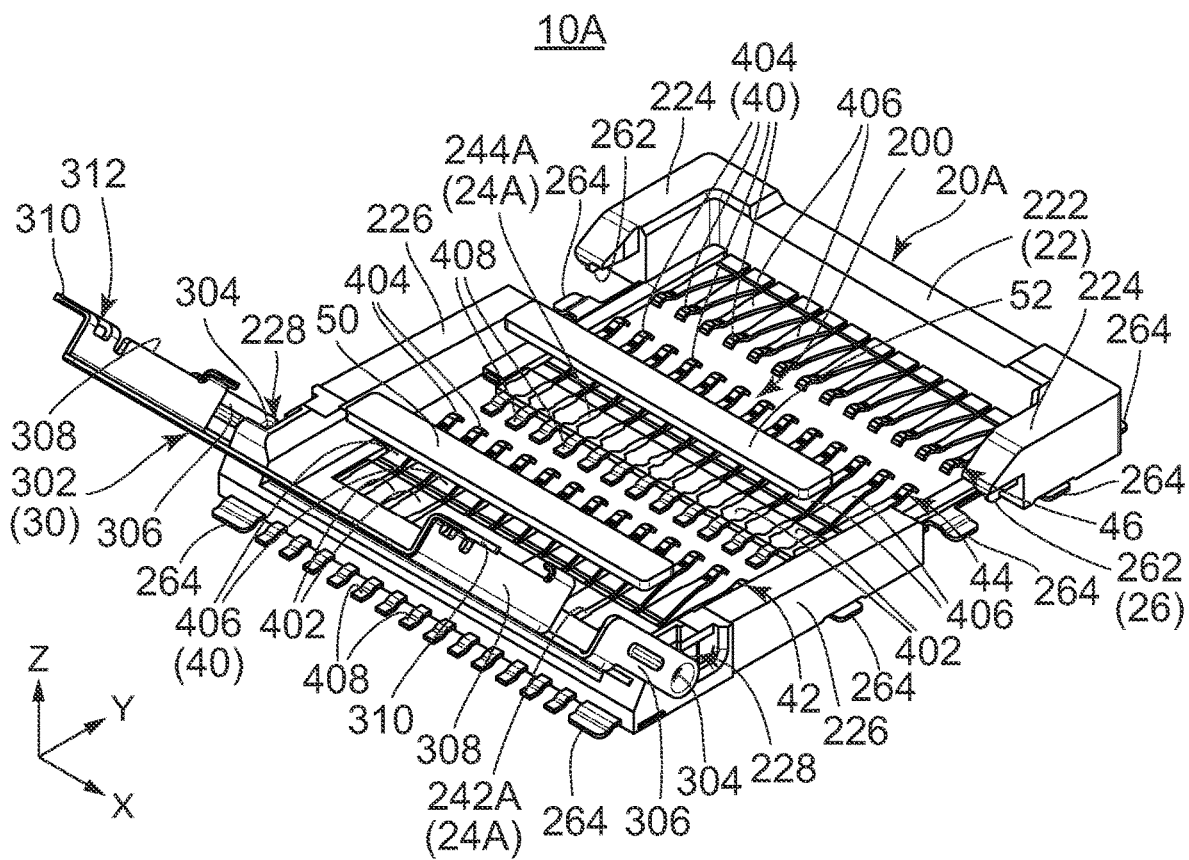
FIG. 9 is an exploded, perspective view showing a connector according to a second embodiment of the present invention. A cover of the connector is positioned at an open position.

Referring to FIG. 9, a connector 10A according to a second embodiment of the present invention is provided with a base 20A, a cover 30, a plurality of terminals 40 and heat conductive members 50 and 52. The base 20A is different in shape from the base 20 of the connector 10 according to the first embodiment. In detail, the base 20A has holding portions 242A and 244A different from the holding portions 242 and 244 of the connector 10, respectively. The connector 10A is formed as the same as the connector 10 except for the base 20A.

As shown in FIG. 9, the holding portion 242A of the base 20A exposes upper surfaces of the held portions 402 of the terminals 40 of the first row 42. Moreover, the holding portion 244A of the base 20A exposes upper surfaces of the held portions 402 of the terminals 40 of the second row 44. In other words, each of the held portions 402 of the terminals 40 of the first row 42 and the second row 44 has an exposed portion.

As shown in FIG. 9, the whole of each of the upper surfaces of the held portions 402 of the terminals 40 of the first row 42 is exposed on a surface of the holding portion 242A. Moreover, the whole of each of the upper surfaces of the held portions 402 of the terminals 40 of the second row 44 is exposed on a surface of the holding portion 244A. However, the present invention is not limited thereto. The exposed portion may be a part of the upper surface of the held portions 402. Alternatively, the exposed portion may be a part of a protrusion portion formed to protrude upward from the upper surface of the held portion 402. In those cases, a shape of each of the heat conductive members 50 and 52 may be changed to come into direct contact with the held portions 402 of the terminals 40 if necessary.

Figure 10:
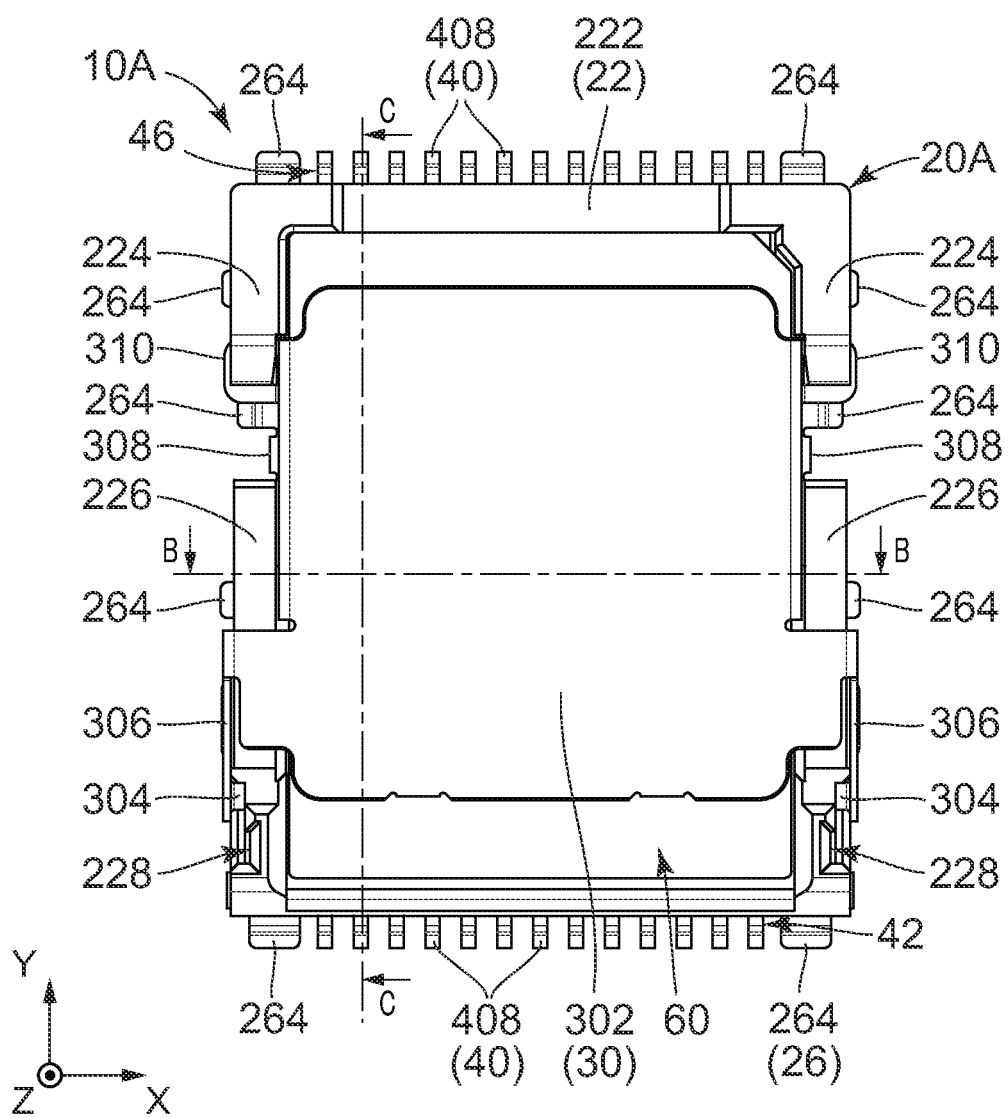
FIG. 10 is a plan view showing the connector of FIG. 9. The cover is positioned at a locked position. The cover holds a card-type device, and the card-type device is accommodated in an accommodation portion of a base of the connector.
Figure 11:
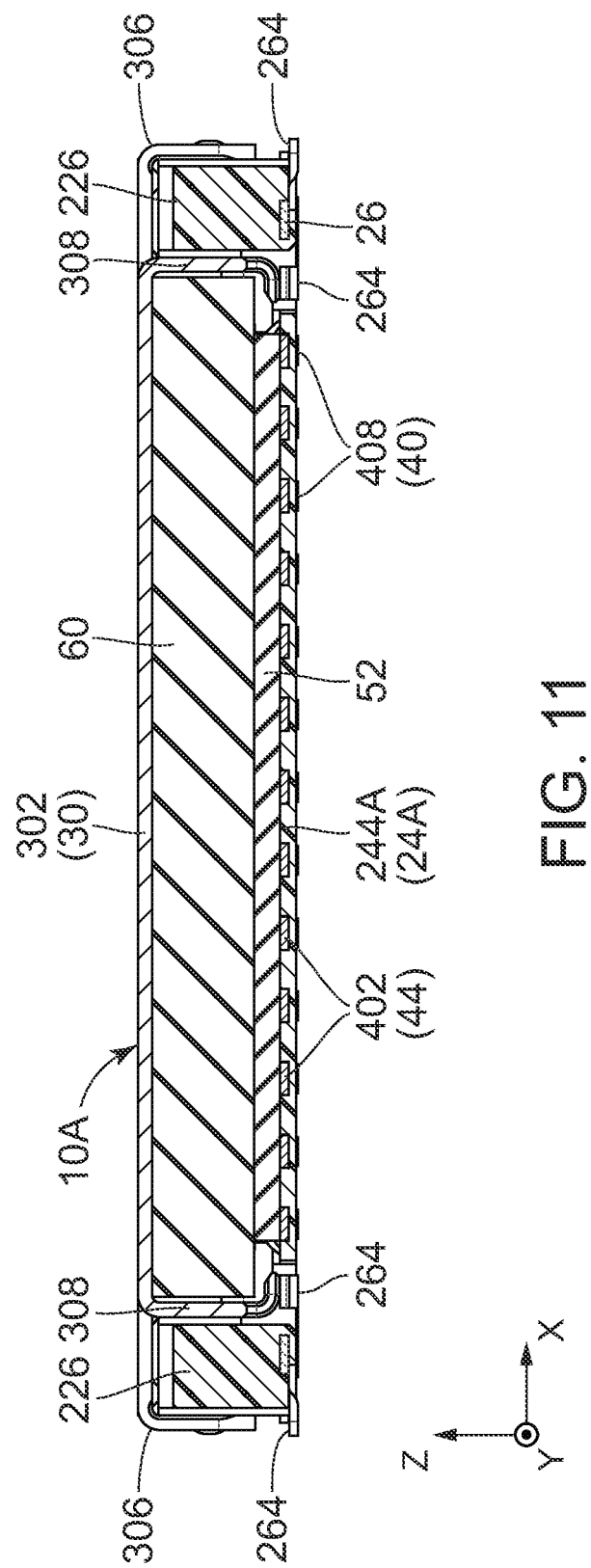
FIG. 11 is a cross-sectional view showing the connector of FIG. 10, taken along line B-B.
Figure 12:
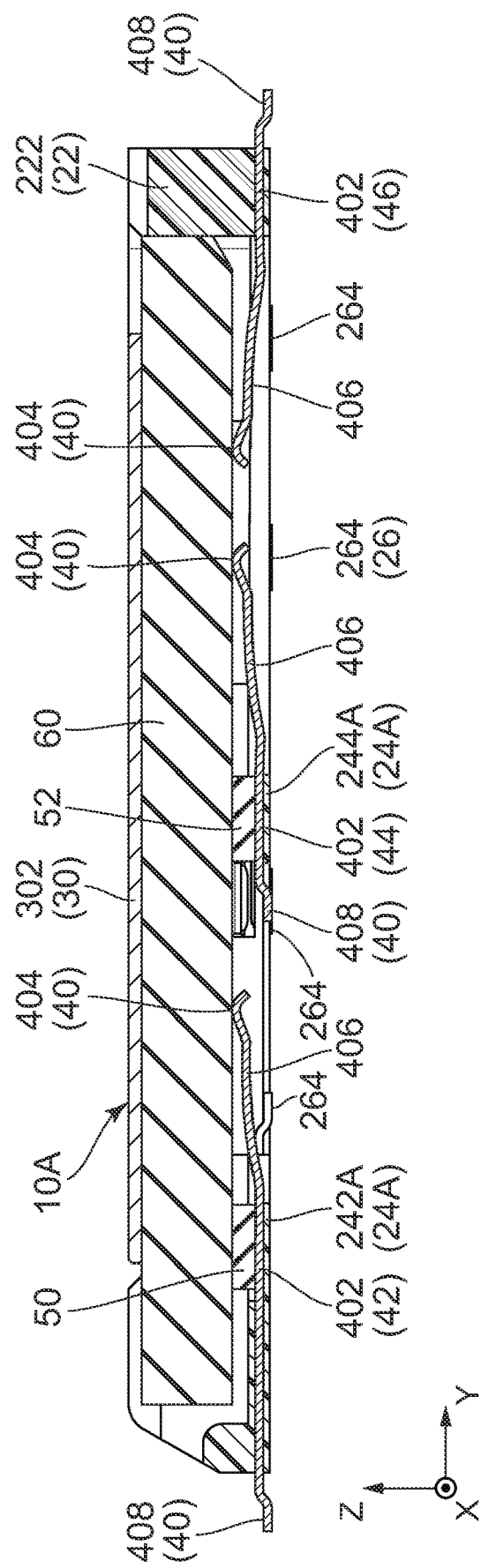
FIG. 12 is a cross-sectional view showing the connector of FIG. 10, taken along line C-C.
Figure 13:
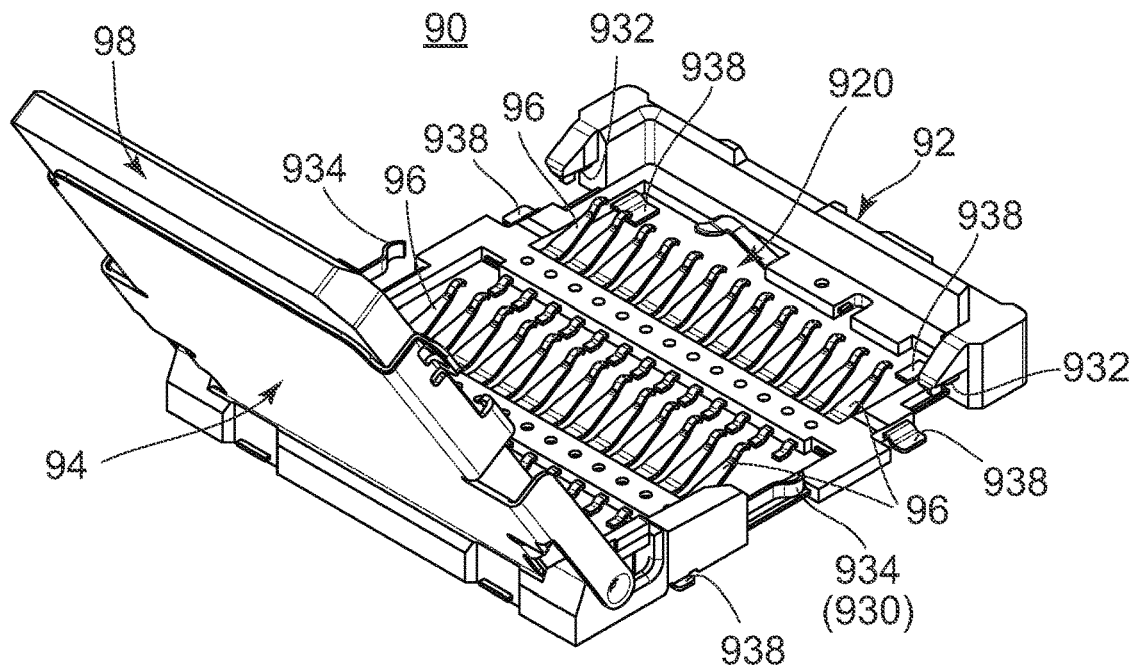
FIG. 13 is a perspective view showing a connector described in Patent Document 1. A cover of the connector is positioned at an open position.
Figure 14:
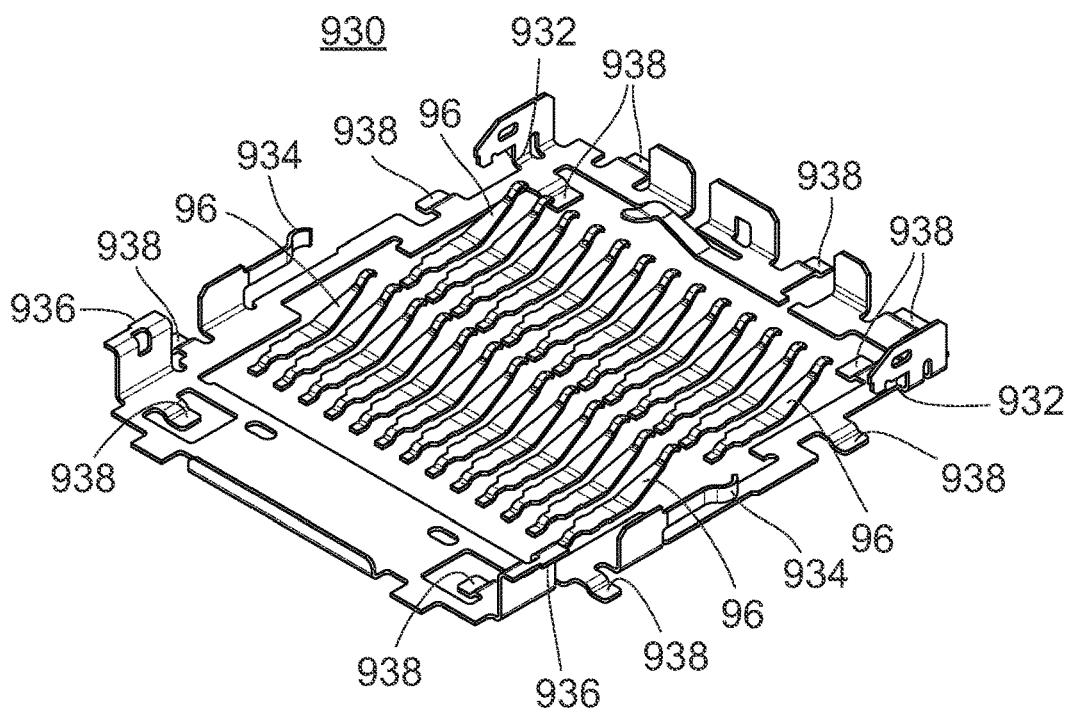
FIG. 14 is a perspective view showing a frame and terminals which are included in the connector of FIG. 13.

As understood from FIGS. 10, 11 and 12, when the card 60 is connected to the connector 10, the heat conductive member 52 is sandwiched between the card 60 and the holding portion 244A. At this time, the heat conductive member 52 comes into direct contact with the exposed portions of the held portions 402 of the terminals 40 of the second row 44. Similarly, the heat conductive member 50 is sandwiched between the card 60 and the holding portion 242A and comes into direct contact with the exposed portions of the held portions 402 of the terminals 40 of the first row 42 when the card 60 is connected to the connector 10. Thus, in the connector 10A, the heat conductive members 50 and 52 come into direct contact with the exposed portions of the held portions 402 of the terminals 40. The terminals 40 are made of metal and have thermal conductivity higher than those of the holding portions 242A and 244A made of insulating resin. Accordingly, the connector 10A can conduct the heat of the card 60 to the circuit board (not shown) with high efficiency in comparison with the connector 10 according to the first embodiment.

Although the specific explanation about the present invention is made above referring to the embodiments, the present invention is not limited thereto but susceptible of various modifications and alternative forms without departing from the spirit of the invention. For example, the number of the holding portions may be one or three or more in accordance with the arrangement of the terminals 40 and the structure of the base 20 although it is two in each of the aforementioned embodiments. Although the terminals 40 held by the holding portion 244 or 244A are arranged so that the support portions extend forward and the fixed portions 408 extend rearward in each of the aforementioned embodiments, they may be arranged so that the support portions 406 extend rearward and the fixed portions 408 extends forward. The terminals 40 may be arranged so that all of the support portion 406 of the terminals 40 extend in the same direction. Furthermore, the present invention is applicable to a connector having a heat conduction path which does not pass through a terminal, such as the connector described in Patent Document 1.

What is claimed is:

1. A connector connectable to a card-type device, wherein:
   the connector is mounted on a circuit board when used;
   the connector comprises a base, a cover, a plurality of terminals and a heat conductive member;
   the base defines a card accommodation portion which accommodates the card-type device;
   the base has a holding portion made of insulation;
   the holding portion has a surface directed to the accommodation portion;
   the cover is arranged so as to cover the card-type device in an up-down direction when the card-type device is connected to the connector in the accommodation portion;
   the terminals are arranged in a pitch direction perpendicular to the up-down direction;
   each of the terminals has a held portion, a contact point and a fixed portion;
   the held portion is held by the holding portion;
   the contact point is located in a position different from that of the held portion in a front-rear direction perpendicular to both of the up-down direction and the pitch direction;
   the contact point comes into contact with the card-type device when the card-type device is connected to the connector;
   the fixed portion is fixed to the circuit board when the connector is mounted on the circuit board;
   the heat conductive member is provided on the surface of the holding portion;
   the heat conductive member is arranged so as to extend over two or more of the terminals in the pitch direction; and
   the heat conductive member is sandwiched between the card-type device and the holding portion when the card-type device is connected to the connector.

2. The connector as recited in claim 1, wherein:
   in each of the terminals, the held portion has an exposed portion;
   the exposed portion is exposed on the surface of the holding portion;
   the exposed portion is in contact with the heat conductive member at least when the card-type device is connected to the connector.

3. The connector as recited in claim 1, wherein the heat conductive member has elasticity.

4. The connector as recited in claim 3, wherein the heat conductive member is made of thermal rubber.

5. The connector as recited in claim 1, wherein:
   the connector has a hinge mechanism; and
   the cover is attached to the base by means of the hinge mechanism.

* * * * *